(12) United States Patent
Sharma et al.

(10) Patent No.: US 7,668,487 B2
(45) Date of Patent: Feb. 23, 2010

(54) PRINTED CIRCUIT BOARD PRINTING SYSTEM

(75) Inventors: Manish Sharma, Sunnyvale, CA (US); Lung Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/481,310

(22) Filed: Jun. 9, 2009

(65) Prior Publication Data

US 2009/0263162 A1   Oct. 22, 2009

Related U.S. Application Data

(62) Division of application No. 10/958,007, filed on Oct. 4, 2004, now Pat. No. 7,560,215.

(51) Int. Cl.
*G03G 15/10* (2006.01)
(52) U.S. Cl. .................................................. 399/237
(58) Field of Classification Search ................. 399/233, 399/237
See application file for complete search history.

(56) References Cited

U.S. PATENT DOCUMENTS

| | | | |
|---|---|---|---|
| 6,026,271 A | 2/2000 | Saitoh | |
| 6,201,940 B1 | 3/2001 | Lee | |
| 6,389,259 B2 | 5/2002 | Kim | |
| 6,608,982 B2 | 8/2003 | Shin et al. | |
| 6,745,463 B1 | 6/2004 | Chou | |
| 6,751,861 B2 | 6/2004 | Ohira et al. | |
| 6,753,483 B2 | 6/2004 | Andoh et al. | |
| 2001/0031156 A1 | 10/2001 | Chae et al. | |
| 2001/0043825 A1 | 11/2001 | Kim | |

*Primary Examiner*—David M Gray
*Assistant Examiner*—Gregory H Curran (57) ABSTRACT

The invention provides a printed circuit board (PCB) printing system. In a particular embodiment, the system includes a liquid electrophotographic printing device. At least one supplier of electrically conductive ink supplying electrically conductive ink to the electrophotographic printing device is also provided. In addition, at least one supplier of dielectric ink supplying dielectric ink to the electrophotographic printing device is also provided. The liquid electrophotographic printing device is operable to apply the electrically conductive ink and the dielectric ink to a provided substrate such that substantially immiscible boundary delineation occurs at any points of contact between the applied electrically conducive ink and the applied dielectric ink. An appropriate method of use for the rendering of a printed circuit board is also provided.

8 Claims, 9 Drawing Sheets

PRINTED CIRCUIT BOARD PRINTING SYSTEM

CROSS-REFERENCE TO RELATED APPLICATIONS

This Application is a Divisional of U.S. application Ser. No. 10/958,007, filed Oct. 4, 2004, now U.S. Pat. No. 7,560,215, and is hereby incorporated by reference.

FIELD OF THE INVENTION

The present invention relates generally to a system and method of rendering printed circuit boards, and more specifically to the use of liquid electrophotographic printing in rendering printed circuit boards.

BACKGROUND

Computers, televisions, communication devices, consumer electronics and the vast majority of electronic equipment rely upon the printed circuit board (PCB) to interconnect and interface internal electrical components. For example, the PCB known as a computer motherboard provides interconnection and interface between memory stores, processors, switches and a host of other components that collectively operate as a desktop or laptop computer. In other words, a PCB is the platform to which other electronic devices are commonly attached so as to interact as a greater system or device.

Early PCB's were relatively simple as the number of components was low and the size and complexity of the attached components were also relatively simple. As electronic components and apparatuses, such as cell phones and personal data assistants, became smaller, thinner and more advanced in performance ability, PCB's for such devices have become more complex and higher density.

With advancements in nano-scale fabrication of semiconductor devices, more and more components may be desired upon a PCB. Contemporary PCB boards often require high resolution manufacturing techniques and precision. In addition, whereas once the interconnection circuits on a PCB were commonly on only one surface, modern system often require at least two layers. In some instances this may be achieved by providing a PCB with a circuit trace on both the top and bottom surfaces, generally requiring either two substrates to be joined as a single PCB, or careful fabrication processes so as to not foul one side while rendering the other, and/or multi-level fabrication.

The fabrication process for a conventional PCB is typically quite involved. An insulating substrate is provided with a thin copper (or other conductive metal) layer deposited across the top surface. To function as a PCB, the circuit or trace lines need to be defined. One typical method used to establish the trace lines from the metal layer is the well known process of photolithography.

Generally speaking, a photo-resist layer, also commonly known simply as a photoresist, or even resist, is deposited upon the metal layer, typically by a spin coating machine. A mask is then placed over the photo resist and light, typically ultra-violet (UV) light is applied. During the process of exposure, the photoresist undergoes a chemical reaction. Generally the photoresist will react in one of two ways.

With a positive photoresist, UV light changes the chemical structure of the photoresist so that it is soluble in a developer. What "shows" therefore goes, and the mask provides an exact copy of the patterns which are to remain—such as, for example the trace lines of a circuit.

A negative photoresist behaves in the opposite manner—the UV exposure causes it to polymerize and not dissolve in the presence of a developer. As such the mask is a photographic negative of the pattern to be left. Following the developing with either a negative or positive photoresist, blocks of photoresist remain. These blocks may be used to protect portions of the original metal layer, serve as isolators or other components.

In typical PCB fabrication, the photoresist blocks protect portions of the metal layer as an etching process is performed. It is generally understood that an etching process such as ion etching, is accomplished by either of two traditional processes, a physical process or an assisted physical process. In a physical etching environment no chemical agent is provided. Rather, the removal of material is entirely dependent upon the physical impact of ions knocking atoms off the material surface by physical force alone. Physical ion etching is commonly referred to as ion milling or ion beam etching.

In an assisted physical process, such as a reactive ion etching process (or RIE), removal of material comes as a combined result of chemical reactions and physical impact. Generally the ions are accelerated by a voltage applied in a vacuum. The effect of their impact is aided by the introduction of a chemical that reacts with the surface being etched. The reaction makes the surface softer and as such, increases both the relative control of the etching as well as the etching rate.

Once the etching process is complete, the remaining photoresist blocks are removed, normally by dissolving them with a chemical agent. If a trace is intended to cross another trace, a dielectric layer may be applied, followed by another application of photoresist to be masked, exposed and etched so as to insulate portions of some traces while providing contact spots for other traces. Typically a multi layer PCB board is achieved by laminating multiple thin layers together, each layer having previously lithographically established traces.

Although the photolithographic process has been described in general terms, it is still apparently obvious that it is a complex and involved process. As it is a process involving the removal of material (the metal being etched as well as the photoresist) it is also a somewhat wasteful process. Recapture of materials for re-use may or may not be economically feasible. In addition, many of the materials and chemicals used may be harmful to the general environment.

Further still, the multiple steps are time consuming. It is also not uncommon to experience some percentage of failure due to defects in the masking and etching process which may or may not be detected prior to the final PCB being provided for testing and or component assembly.

Although current PCB architecture is largely aided with computer drafting, it is not uncommon for prototype systems to require several versions and revisions to a PCB. Indeed, with a new system, or simply to test new semiconductor structures such as memory devise and processors, it is not uncommon to utilize repeated copies of the same PCB architecture and or to rapidly evolve the PCB architecture as refinements are made with the attaching components. As such the time, cost, materials and other factors of the photolithographic processes traditionally used in PCB fabrication may be aggregated and aggravated.

Hence, there is a need for a system and method of rendering PCB's that overcomes one or more of the drawbacks identified above.

SUMMARY

The present disclosure advances the art and overcomes problems articulated above by providing a system and method for rendering printed circuit boards.

In particular and by way of example only, according to an embodiment, provided is a printed circuit board (PCB) printing system including: a liquid electrophotographic printing device; at least one supplier of electrically conductive ink supplying electrically conductive ink to the electrophotographic printing device; at least one supplier of dielectric ink supplying dielectric ink to the electrophotographic printing device; wherein the liquid electrophotographic printing device is operable to apply the electrically conductive ink and the dielectric ink to a provided substrate such that a substantially immiscible boundary delineation occurs at any points of contact between the applied electrically conductive ink and the applied dielectric ink.

DETAILED DESCRIPTION

Before proceeding with the detailed description, it is to be appreciated that the present teaching is by way of example, not by limitation. The concepts herein are not limited to use or application with a specific type of printed circuit board (PCB) printing system. Thus, although the instrumentalities described herein are for the convenience of explanation, and shown and described with respect to exemplary embodiments, it will be appreciated that the principles herein may be equally applied in other types printed circuit board (PCB) printing system. It will be appreciated that the drawings are not necessarily drawn to scale and may be expanded in certain aspects for ease of discussion.

Figure 1:
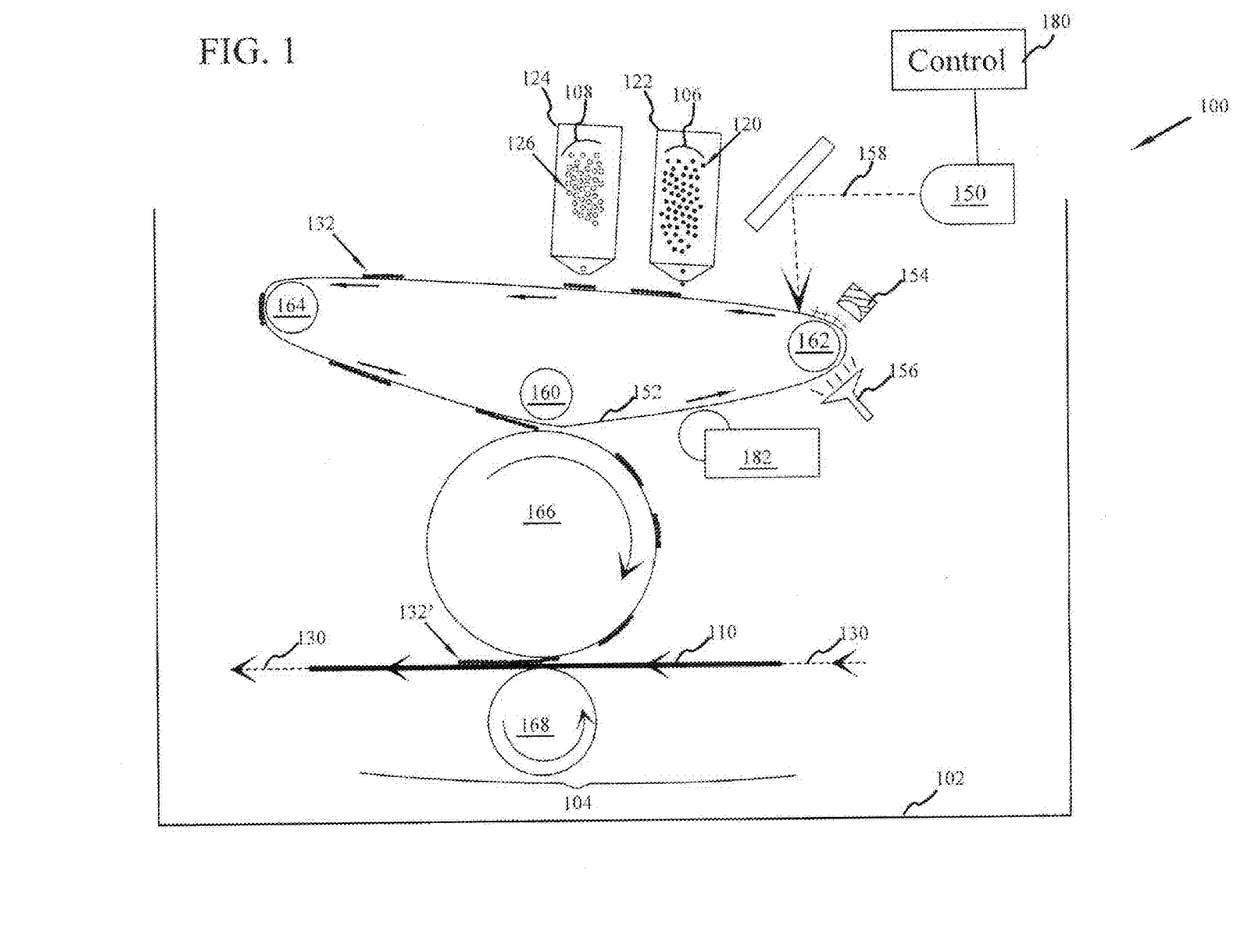
FIG. 1 is a plan view of a printed circuit board (PCB) printing system according to an embodiment.

Referring now to the drawings, and more particularly to FIG. 1, there is shown a portion of a PCB printing system 100 according to an embodiment, having a case 102, at least one liquid electrophotographic printing device 104, at least one supplier of electrically conductive ink 106, and at least one supplier of dielectric ink 108. In a roll-to-roll printing environment, the case 102 may or may not entirely enclose all elements of the system.

PCB printing system 100 has a print receiving media path 130 proximate to the at least one liquid electrophotographic printing device 104. In at least one embodiment, electrical ink supplier is an electrical ink reservoir 122 and dielectric ink supplier is a dielectric ink reservoir 124. In at least one embodiment both reservoirs 122, 124 are removable and or refillable.

A substrate 110 is provided to the PCB printing system 100 along media path 130. Substrate 110 is of an appropriate type to receive both electrically conductive ink 106 and dielectric ink 108. In at least one embodiment, the substrate 110 is a flexible substrate suitable, such as for example a flexible substrate used in roll-to-roll fabrication processes.

In an embodiment, the electrically conductive ink 106 is an ink such as a metal-colloidal ink consisting of metallic particles. Specifically, the metal-colloidal ink has metallic nanoparticles selected from the group consisting of copper, gold, silver, platinum, or other electrically conductive metals or alloys.

The dielectric ink 108 may be a printable polymer material. In at least one embodiment, the dielectric ink 108 is a printable polymetric material. The use of polymetric material may be preferred over a more basic polymer as the combination of materials combined to achieve the polymetric characteristic may provide improved characteristics such as breakdown, adhesion and greater control over application thickness In a traditional liquid electrophotographic printing system, the utilized ink is a liquid substance composed of oil or solvent, pigment and a polymer. The pigment is typically black, or a color such as cyan, magenta and/or yellow. The purpose of the pigment is to provide a visual image such as a chart, graph, photo or text. By mixing the primary color inks (red/green/blue or cyan, magenta/yellow) a fall spectrum of colors may be obtained.

The pigment is blended with the polymer particles so that when heated the polymer will melt. In a melted form the polymer and pigment will adhere to the media substrate to which it is applied. Force, typically from a roller, may be applied to assist in binding the melted polymer and pigment to the media substrate.

In PCB printing system 100, the issue of pigment specifically for visual image purposes is not highly important. For electrically conductive ink 106, metallic particles 120 are combined with a polymer in addition to or in place of a pigment. As shown in the figures, metallic particles 120 are represented as filled circles.

The metallic particles 120 are suspended in an oil or solvent solution. When printed, with or without an additional pigment, the electrically conductive ink 106 is visible, thus permitting the system operator to visually inspect the printed PCB board. In at least one embodiment, the metallic particles 120 are less than 100 nm in size.

Electrically conductive ink 106 has a high concentration of metallic particles 120. Specifically, the concentration of metallic particles relative to the polymer is such that when melted and applied to a media substrate, the metallic particles 120 will have sufficient contact with one another so as to establish an electrical conductor of the relative shape and size of the area of printed electrically conductive ink 106. Not all particles need to be in contact: only enough particles need touch that there is conduction from one end of the printed pattern to the other. Thus, the size, shape and intrinsic conductivity of the particles and also the printed layer thickness together determine the overall conductance of the printed pattern.

Dielectric ink 108 comprises non-conductive polymer particles 126 (or polymetric particles as indicated above) suspended in an oil or solvent solution. As shown in the figures, non-conductive ink particles 126 are shown as hollow circles. For purposes of the PCB to be printed, a non-conductive polymer is considered that which will not conduct electricity under normal PCB operating conditions. Specifically, when applied, the dielectric ink 108 will form a layer of dielectric insulation of the relative shape and size of the printed dielectric ink 108. In at least one embodiment the dielectric ink 108 is a polymetric material. The dielectric particles are of such material that has high dielectric strength. In some cases, the dielectric particles may be made of insulator materials such as oxides, nitrides, and organic insulating materials. In other cases, the dielectric particles may be made of a combination of conducting materials coated with dielectric insulating materials. The presence of conducting material within the dielectric particles 126 may, in combination with the oil and solvent in which the particles are dissolved, aid in charging of the ink during the LEP process, but does not provide a conductive property to the dielectric ink 108.

The resolution often desired for PCB boards is quite small so as to permit a high density of components and electrical trace lines between components to be placed upon the PCB. Dry print materials, such as toners, are typically composed of particulates (i.e the combined pigment and polymer) no smaller than 5 microns.

Use of liquid based electrically conductive ink 106 and dielectric ink 108 permits the use of particulates about one micron in size, thus permitting greater resolution and detail to be provided in the resulting PCB. One micron sized ink particles, as used in PCB printing system 100, are smaller than ink particles used in ink-jet printing systems, thus permitting finer resolution in PCB printing system 100. In addition, PCB printing system 100 permits faster printing, greater precision and control over the points of application then are possible with ink jet printing.

With respect to the prior-art process of lithographic fabrication, PCB printing system 100 may advantageously eliminate the traditional and complex tasks of depositing a conductive layer, depositing a protective resist, exposing the resist, developing the resist to expose portions of the conductive layer, etching the exposed portions of the conductive layer, and then removing the resist. For crossing traces, these lithographic processes are repeated with precise alignment becoming an issue. In addition to avoiding the multitude of traditional lithographic steps, PCB printing system 100 is likely to produce far less waste product.

The principles of electrophotographic printing are well understood in the art, and are briefly summarized herein for the purposes of discussion with respect to FIGS. 1 through 12.

Figure 2:
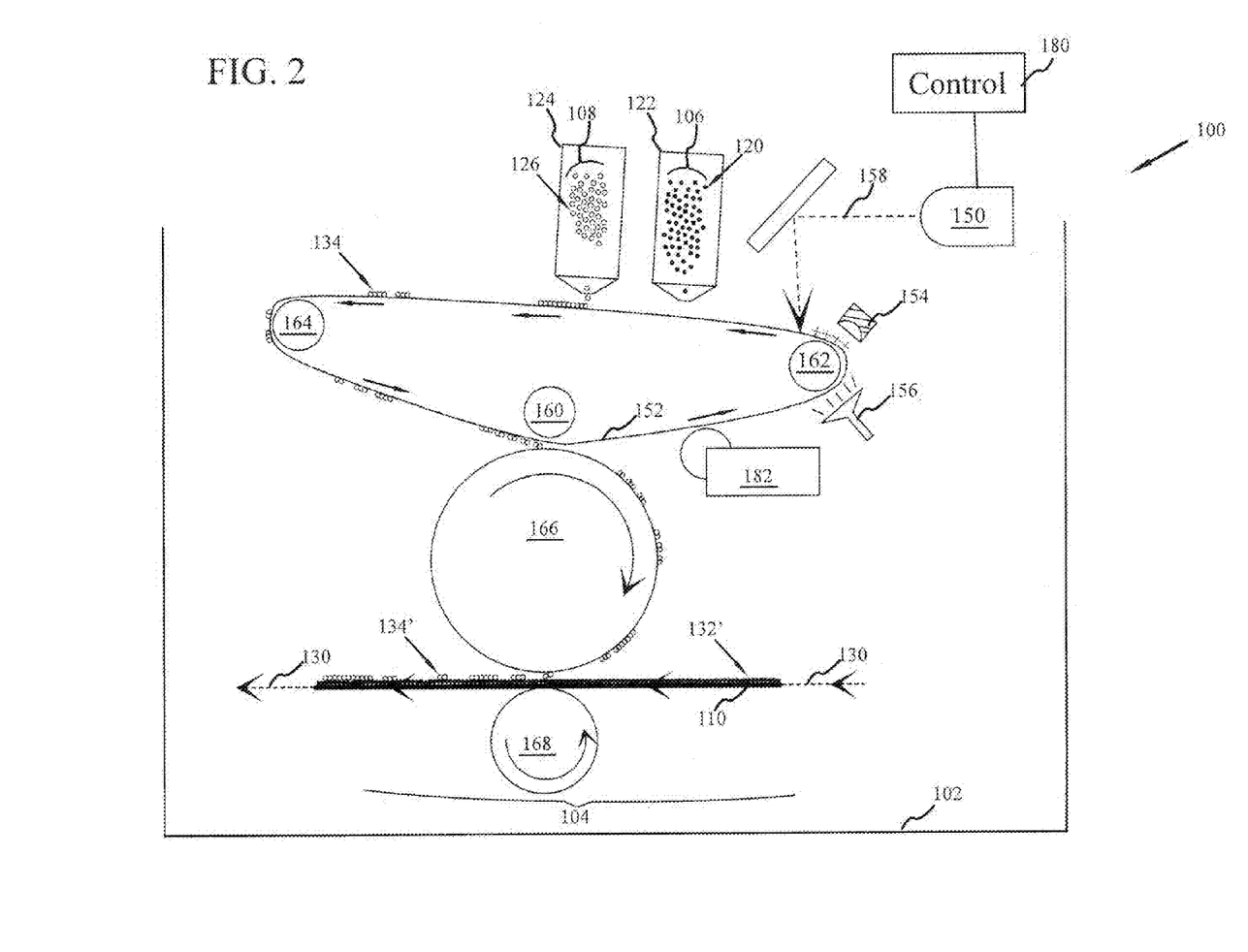
FIG. 2 is an additional view of the PCB printing system shown in FIG. 1, further showing the printing of dielectric ink.
Figure 3:
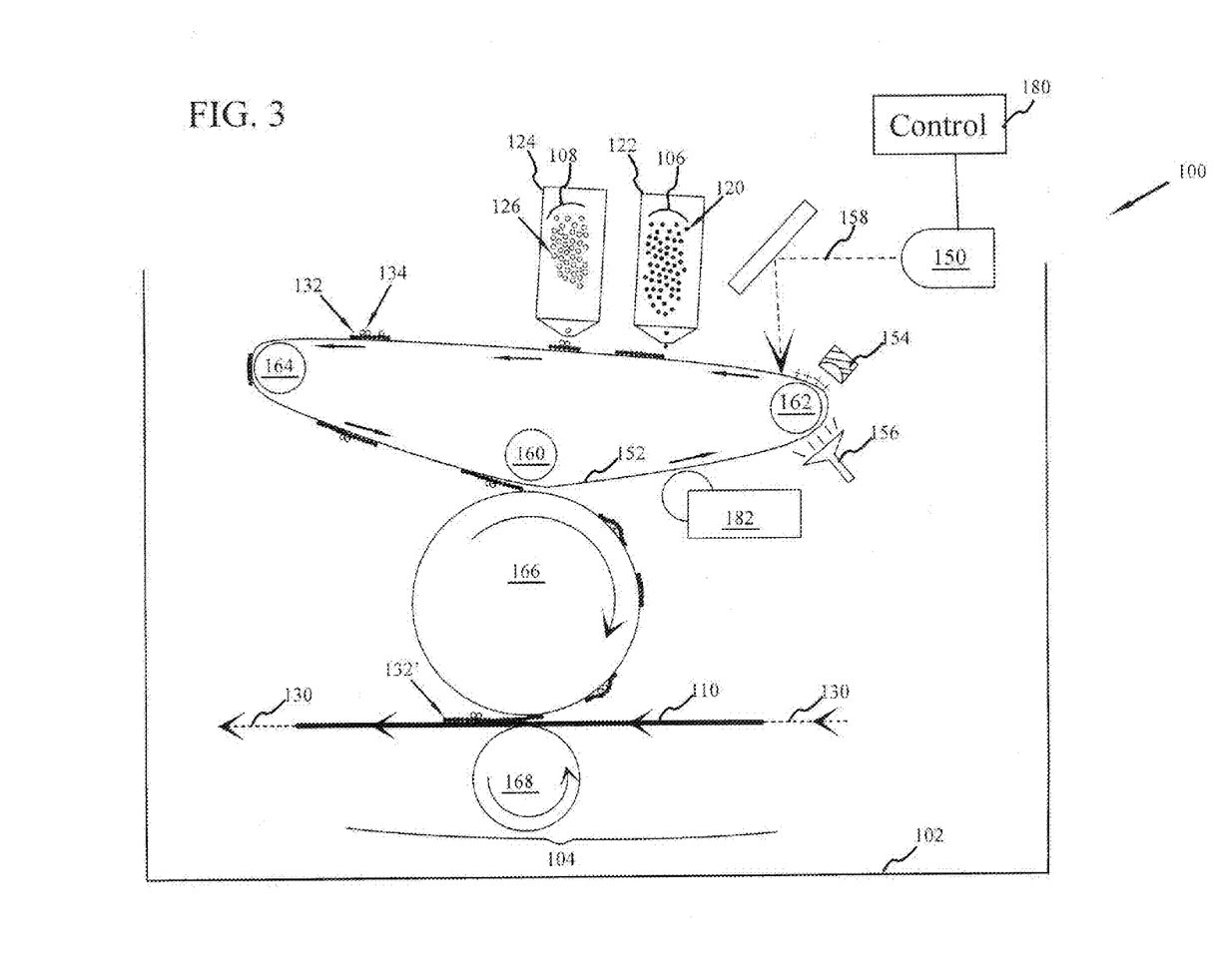
FIG. 3 is a plan view of an alternative embodiment of a PCB printing system.

FIGS. 1~3 conceptually illustrate two embodiments of PCB printing system 100. FIGS. 1 and 2 show an embodiment wherein electrically conductive ink 106 and dielectric ink 108 are applied to a substrate 110 separately FIG. 3 shows an embodiment wherein electrically conductive ink 106 and dielectric ink 108 are applied to a substrate 110 in combination. The component elements for either embodiment are substantially the same.

An electrophotographic printing device 104 is provided having a light source, such as laser 150, a photosensitive medium, such as photosensitive belt 152, a charging device 154, and a discharge device 156. The photosensitive belt 152 is typically made out of a highly photoconductive material that may be discharged by light photons.

Discharge device 156 serves to uniformly discharge photosensitive belt 152 to an initial ready state. A positive charge is applied to the photosensitive belt 152, which circulates past charging device 154, as directed by drive and guide rollers 160, 162, 164. Additional guide rollers may be used, though not shown. In at least one embodiment, charging device 154 is a corona wire.

Photosensitive belt 152 is disposed so as to be optically coupled to the imaging light source, such as the illustrated laser 150. As the charged photosensitive belt 152 circulates, laser 150 directs beam 158 across the surface of photosensitive belt 152 to discharge certain locations (take them from a positive charge to a negative charge). Stated another way, laser 150 draws an electrostatic latent image on photosensitive belt 152. Other photon emitting sources such as, for example, LED's may be used in place of laser 150.

The operation of the light source, such as laser 150, is directed by controller 180. A suitable controller 180 may be comprised of analog circuitry, a digital processor, a CPU programmed with control logic, a device driver, and combinations thereof. Under appropriate circumstances, the controller 180 may be a single device object, or may be comprised of separate components electrically coupled together.

FIG. 1 illustrates the application of electrically conductive ink 106. As the electrostatic latent image of at least a portion of a circuit trace image on the photosensitive belt 152 passes electrical ink reservoir 122, electrically conductive ink 106 (which has been given a positive charge) is attracted from electrical ink reservoir 122 to the photosensitive belt 152. As electrically conductive ink 106 is positively charged, it will cling to the photosensitive belt 152. The electrically conductive ink 106 electrostatically clinging to the photosensitive belt 152 will develop at least a partial image of at least one trace line 132 as part of a circuit trace image as desired for a PCB.

FIG. 2 illustrates the application of dielectric ink 108. As the electrostatic latent image of at least a portion of a circuit trace image on the photosensitive belt 152 passes dielectric ink reservoir 124, dielectric ink 108 (which has been given a positive charge) is attracted from dielectric ink reservoir 124 to photosensitive belt 152. As dielectric ink 108 is positively charged, it will cling to the photosensitive belt 152. The dielectric ink 108 electrostatically clinging to the photosensitive belt 152 will develop at least a partial image of an insulation area 134 for at least one trace line 132 as part of a circuit trace image as desired for a PCB. FIG. 3 illustrates the substantially contemporaneous application of dielectric ink 108 and electrically conductive ink 106 as may be provided in an alternative embodiment.

More specifically, the electrically conductive ink 106, and dielectric ink 108 are not propelled or extruded from their respective reservoirs 122, 124 as is the case with ink-jet printing. The electrically conductive ink 106 and dielectric ink 108 are electrostatically attracted from their respective reservoirs 122, 124, and as such may be applied with enhanced precision. Dielectric ink 108 is attracted to the photosensitive belt 152 in the substantially the same manner as electrically conductive ink 106. To simplify the following discussion, the focus is primarily upon the application of electrically conductive ink 106.

Use of photosensitive belt 152 is generally preferred over a drum, as the electrophotographic ink is oil based or solvent based, and it is desirable to substantially remove the oil or solvent carrier. A photosensitive belt 152 may provide more surface area within the same physical space then may a drum. The travel time across the greater surface area may permit greater evaporation and dispersion of the oil or solvent carrier.

Heat may be applied to assist in dissipating the oil or solvent carrier as well. Heat may be applied by a radiant heat source directed towards photosensitive belt 152, such as by a guide roller 164 including an internal heating element. Dissipating the carrier oil or solvent may increase the electrical connectivity between metallic particles 120 in the applied electrically conductive ink 106.

The heated electrically conductive ink image of the trace lines 132 is then transferred from the photosensitive belt 152 to the provided substrate 110 by transfer roller 166. Additional intermediate transfer rollers may be used, though not shown. The heating establishes an adhesive property within the electrically conductive ink trace line 132, such that it will adhere to the provided substrate 110, previously applied trace lines 132 and or insulation areas 134.

In addition, heating may further fuse the metallic nanoparticles 120 to enhance the conductive properties of conductive ink trace line 132. The heating may also occur during the process of transfer from the photosensitive belt 152 to the transfer roller 166, in place of or in addition to earlier heating.

A press roller 168 assists in bonding the developed ink image to substrate 110. In addition to, or in place of the heat that may be applied to ink deposited upon photosensitive belt 152, a second heating element (not shown) may be disposed proximate to the substrate 110 to further assist in bonding the applied ink to the substrate 110, and or to further dissipate the oil or solvent carrier of the ink.

In at least one embodiment, spent ink not transferred to transfer roller 166 may be removed from photosensitive belt 152 by a spent ink remover 182. Spent ink may be collected for later disposal, or re-circulated back to the appropriate reservoir for reuse. Spent ink remover 182 may also serve to clean photosensitive belt 152 in preparation for the rendering of the next electrostatic image established to attract electrically conductive ink 106 or dielectric ink 108. A clean photosensitive belt 152 is generally preferred as it will permit the rendering of a more precise electrostatic image.

Typically, in color liquid electrophotographic printing, a full spectrum of colors is created by precise mixing of base colors—such as Red/Green/Blue or Cyan/Magenta/Yellow. More specifically, as the inks are applied, they blend together. With an electrical device such as a PCB, it is desirable to establish insulated areas between, around or above conductive areas. Such insulation may be desired to insulate a single layer PCB or to permit the fabrication of a multi layer PCB.

To achieve dielectric insulation, between, around, or above conductive areas, it is highly desirable for the electrically conductive ink 106 and dielectric ink 108 to not mix with one another when applied. More specifically, in an embodiment a substantially immiscible boundary delineation is formed between contact portions of the electrically conductive ink 106 and the dielectric ink 108.

Different methods may be used to accomplish the conductive and non-conductive layering in the printing of a PCB. FIGS. 4, 5, 6, 7, 8 and 9 are provided to assist with illustrating at least two embodiments.

Figure 4:
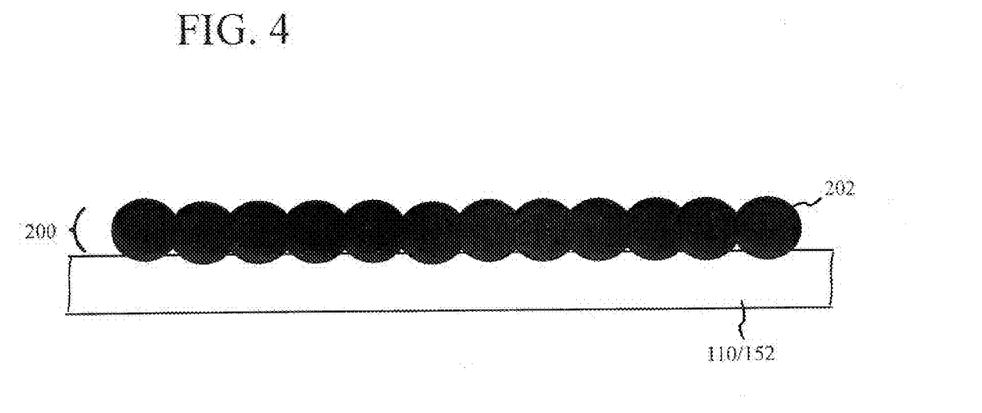
FIG. 4 is an enlarged side view of a first layer having a conductive trace line established with conductive ink under an embodiment.

FIG. 4 provides a cross section view of a first layer 200, of electrically conductive ink traces 202 developed upon photosensitive belt 152 for transfer printing to substrate 110 shown in FIG. 1. Upon transfer, the appearance of first layer 200 upon substrate 110 is substantially the same as it was upon the photosensitive belt 152.

Figure 5:
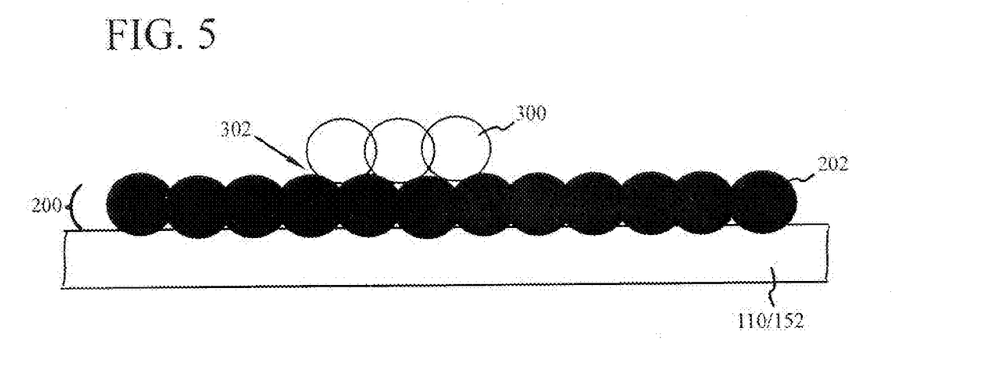
FIG. 5 illustrates the additional application of dielectric ink upon the trace line shown in FIG. 4.

In one embodiment, at least one area 300 of dielectric ink 108 is printed upon at least one printed trace 202, see FIG. 5. As shown in FIG. 2, the dielectric ink 108 may be printed separately from the electrically conductive ink 106, or as shown in FIG. 3 it may be printed substantially contemporaneously. As is conceptually illustrated, there is a substantially immiscible boundary delineation 302 between the conductive ink 106 and dielectric ink 108.

Although some intermixing may occur on a molecular level at the points of contact, the inks do not intermix and blend. More specifically, although the inks bond to one another, the dielectric properties of the dielectric ink 108 remain substantially intact so as to provide an area of electrical insulation during PCB operation.

Figure 6:
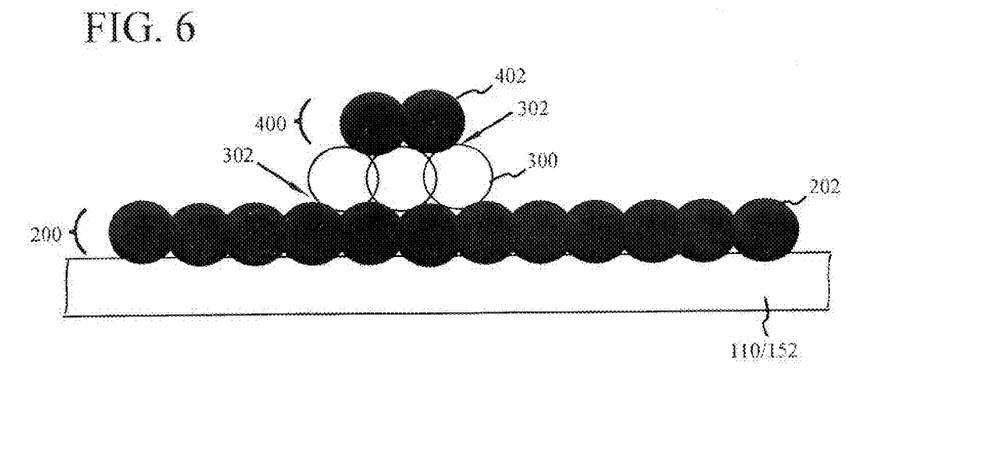
FIG. 6 illustrates the additional application of a second layer having a conductive trace line upon the dielectric ink of FIG. 5.

As shown in FIG. 6, in an embodiment to provide a multilayer PCB, a second layer 400 of conductive traces 402 is printed atop area 300 of dielectric ink 108. As FIG. 4, like FIGS. 2 and 3 is a cross section view, only one trace 202 is shown in first layer 200 and only one trace 402 is shown in second layer 400, trace 402 crossing trace 202.

In PCB printing system 100, the application of ink is at least a two step process. By depositing either electrically conductive ink 106 or dielectric ink 108 upon photosensitive belt 152 first and transferring the deposited ink to substrate 110, rather than directly depositing either ink upon substrate 110, electrophotographic printing device 104 may advantageously provide conductive trace lines 202 and insulation areas 300 that are more precise, more conductive and more individually distinct (not intermixed).

Figure 7:
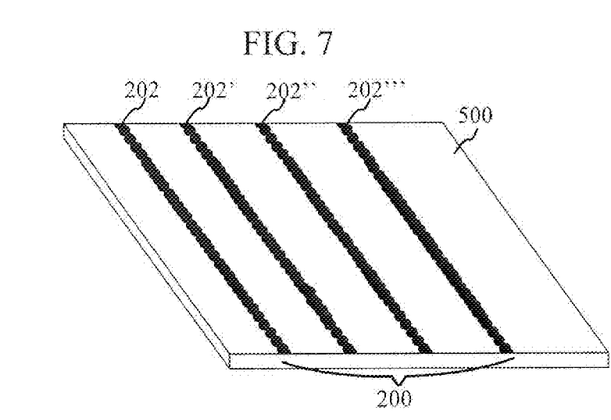
FIG. 7 is a perspective view of a first layer having a plurality of conductive trace lines established with conductive ink under an embodiment.
Figure 8:
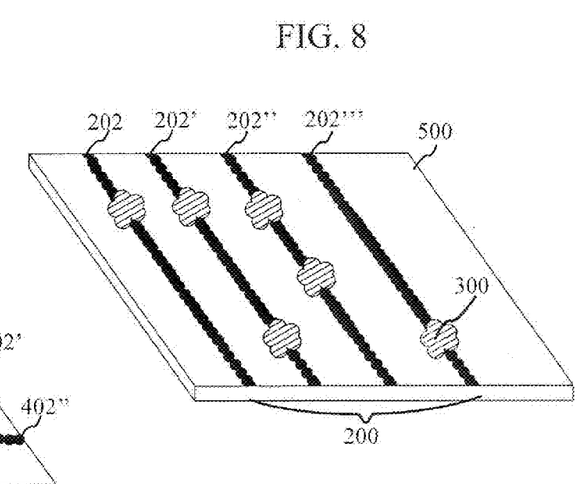
FIG. 8 is a perspective view illustrating the additional application of dielectric ink upon at least a portion of the first layer shown in FIG. 7.
Figure 9:
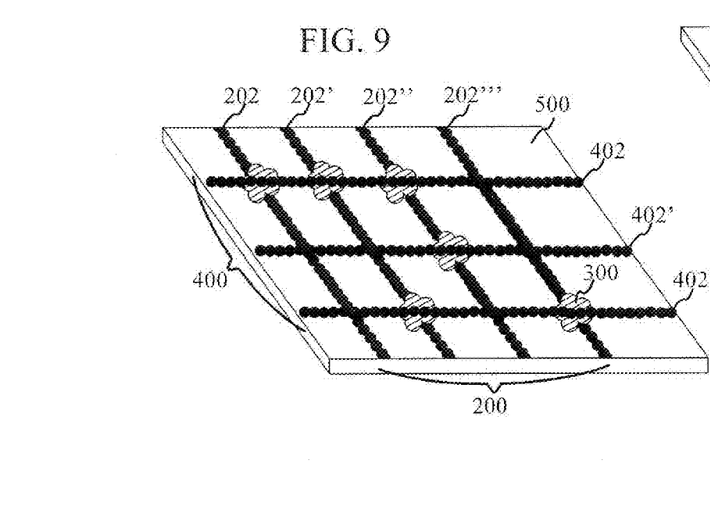
FIG. 9 is a perspective view illustrating the additional application of a second layer upon the first layer and dielectric material shown in FIG. 8.

FIGS. 7, 8 and 9 provide a partial perspective view of a simplified set of first and second layer traces. In FIG. 7 as shown, a first layer 200 of electrically conductive ink traces 202 are set down on media 500. In FIG. 8, areas 300 of dielectric ink are printed upon portions of conductive ink traces 202.

In FIG. 9, a second layer 400 of electrically conductive ink traces 402 are set down, and as shown oriented to cross the first level traces 202. As is more fully appreciated in FIG. 9, the areas 300 of dielectric ink insulate certain first level traces 202 from certain second layer traces 402. This process may be repeated to provide even more layers for the desired PCB.

Traces 202, 402 and dielectric areas 300 therebetween advantageously establish the electrical traces for a PCB without excess waste or complex etch and alignment issues typically experienced with photolithographic processes. In addition, the electrical traces for a PCB are established quickly and may be reproduced rapidly. To provide a substantially complete layer of insulation across the entire printed circuit trace, the electrostatic image upon the photosensitive belt 152 used to attract dielectric ink 106 may be substantially equivalent to the surface area of the ink receiving substrate 110.

In at least one embodiment the first and second trace layers 202, 402 and insulating dielectric areas 300 are printed individually to the photosensitive belt 152 and transferred to the substrate 110 by transfer roller 166. Such a PCB printing system 100 may employ multiple paired sets of photosensitive belts 152 and ink reservoirs, i.e. at least one providing electrically conductive ink 106 and at least one providing dielectric ink 108 as substrate 110 moves relative the system. In such a setting, the media 500 shown in FIGS. 7, 8 and 9 corresponds to substrate 110 shown in FIGS. 1 and 2, and is realigned by PCB printing system 100 for each successive application of ink—electrically conductive or dielectric.

In an alternative embodiment, after electrically conductive ink 106 is deposited to the electrostatic image on photosensitive belt 152, dielectric ink 108 is also deposited to the photosensitive belt 152 before transfer of both inks to the substrate. In such a setting, media 500 shown in FIGS. 7, 8 and 9 corresponds to photosensitive belt 152 shown in FIG. 3.

Figure 10:
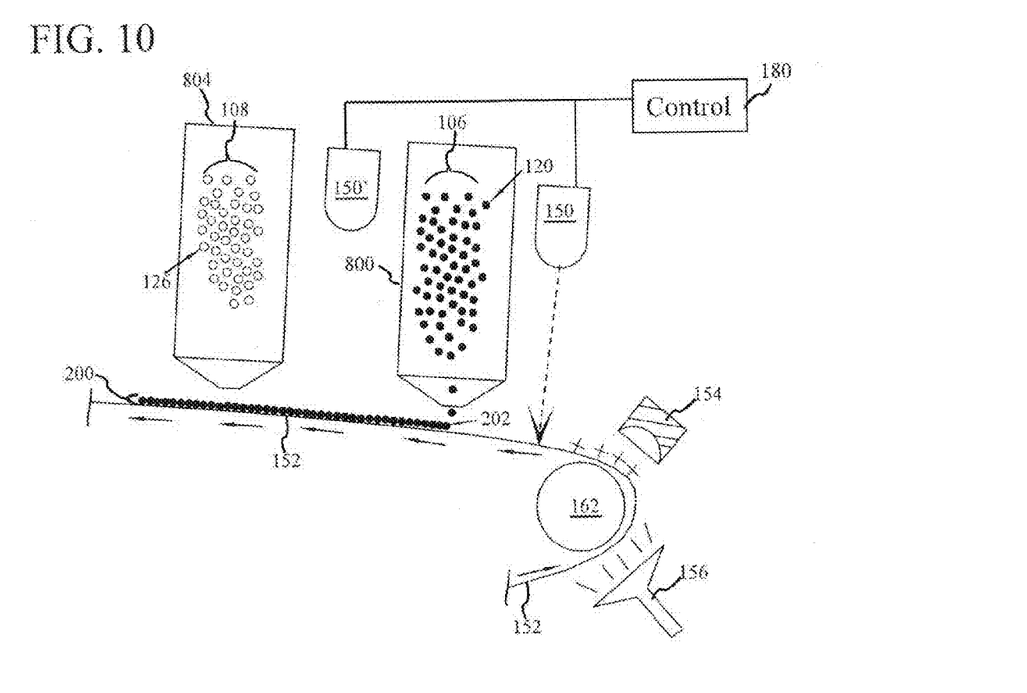
FIG. 10 is an enlarged partial plan view showing the application of electrically conductive ink to the photosensitive belt.
Figure 11:
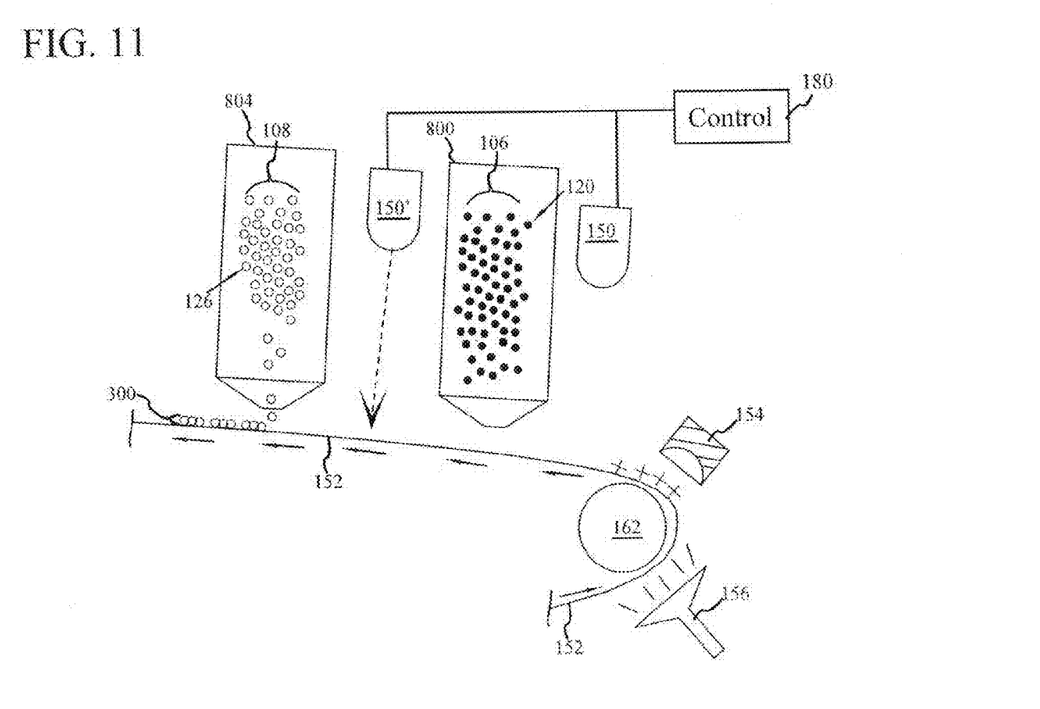
FIG. 11 is an enlarged partial plan view showing the application of dielectric ink to the photosensitive belt.

FIGS. 10 and 11 illustrate a partial enlarged section of an embodiment suggested by FIGS. 1, 2 and 3. More specifically, the first layer 200 of conductive traces 202 is provided by a first electrically conductive ink reservoir 800. Insulation areas 300 are provided by dielectric ink reservoir 804. Electrically conductive ink 106 is applied to photo sensitive belt 152 in accordance with the electrostatic image rendered by laser 150. Dielectric ink 108 is applied to photosensitive belt 152 in accordance with an electrostatic image rendered by initial laser 150, or as shown laser 150'.

FIGS. 10 and 11 further illustrate the application of conductive traces 202 and insulation areas 300 as separate processes upon a clean photosensitive belt 152. Such independent application permits each ink to at least partially dry and or condense, such that upon heating and applying to substrate 110 (not shows), the properties of each ink are further maintained and not blended. Multiple layers of conductive traces 202 may be established by repeated applications of electrically conductive ink 106 and, as necessary insulation areas provided by dielectric ink 108.

Figure 12:
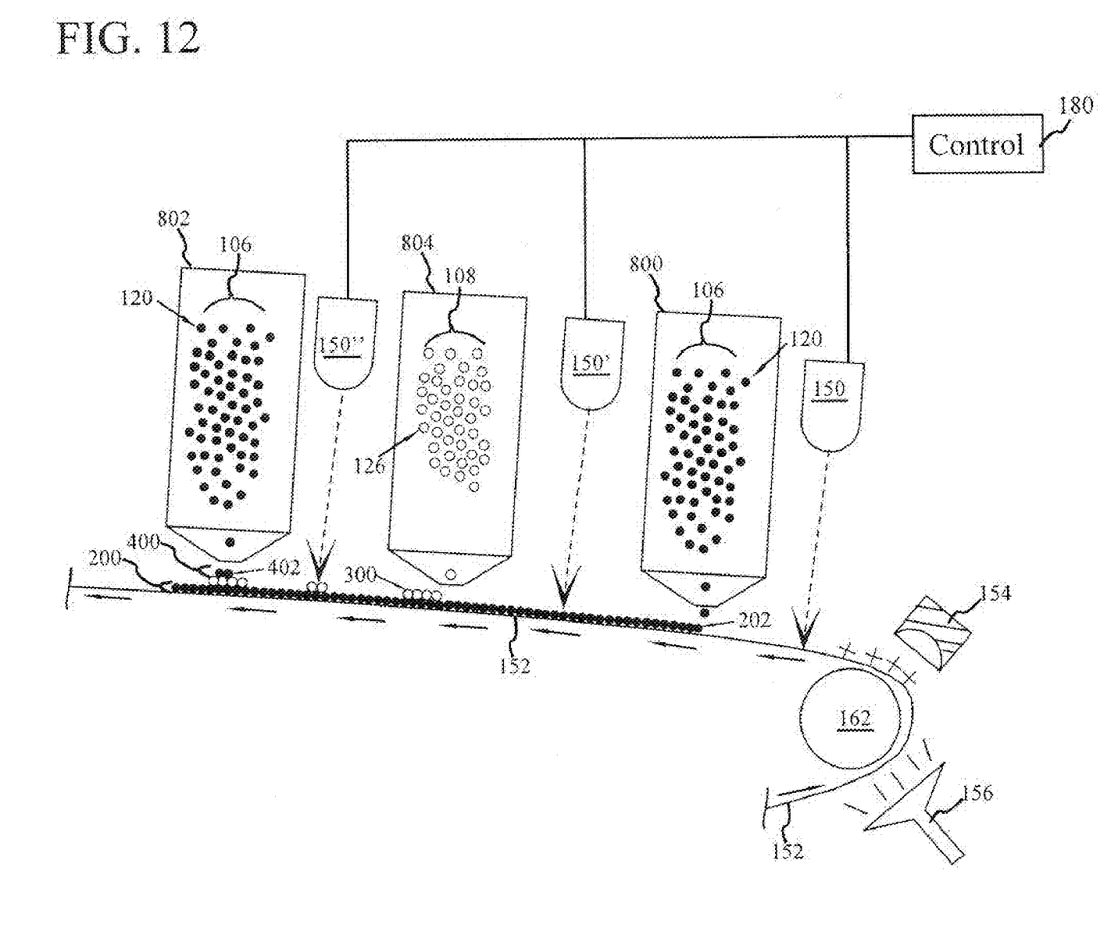
FIG. 12 is an enlarged partial plan view of an alternative embodiment providing multiple electrically conductive ink reservoirs.

FIG. 12 illustrates a partial enlarged section of yet another embodiment of a PCB printing system 100. As shown the first layer 200 of conductive traces 202 is provided by first electrically conductive ink reservoir 800 and second layer 400 of conductive traces 402 is provided by second electrically conductive ink reservoir 802. Insulation areas 300 are provided by dielectric ink reservoir 804 disposed between the first and second electrically conductive ink reservoirs 800, 802. Additional electrically conductive reservoirs and dielectric reservoirs may also be included though not presently shown. FIG. 12 also shows how, in at least one embodiment a first layer 200, second layer 400 and intervening insulation area 300 may be established upon the photosensitive belt 152 for contemporaneous transfer to substrate 110. It is appreciated that multiple electrically conductive reservoirs and dielectric reservoirs may operate individually as well—depositing individual layers for individual transfer, rather than a stacked structure as shown.

With respect to FIGS. 10, 11 and 12, the precision of laser control permits the electrically conductive ink 106 to be applied as individual dots at predetermined interval spacing. The spacing is selected to ensure electrical contact between the printed metallic nano-particles 120, and thus provide precisely placed electrical trace lines.

In a similar fashion, dielectric ink 108 may be applied as individual dots spaced to form a substantially continuous area of dielectric insulation. As shown in FIG. 12, controller 180 may control a plurality of lasers 150, 150', 150". When electrically conductive ink 106 and dielectric ink 108 are applied in series to the photosensitive belt 152 as shown in FIG. 12, the resulting portion of the circuit trace (consisting trace lines and insulation between layers) is transferred to a substrate substantially contemporaneously.

In an alternative embodiment, a single laser 150 may be directed by the controller 180 to render latent images at the multiple points serviced by the multiple lasers 150, 150', 150" shown. As noted above, other photon providing sources may also be employed in place of laser 150.

In one embodiment utilizing multiple ink reservoirs, the latent electrostatic image upon photosensitive belt 152 may be established with different layers of electrostatic intensity. By providing each reservoir of ink with a different magnitude of electrical charge, it is possible to electro statically attract one or more of the inks to the same location.

Figure 13:
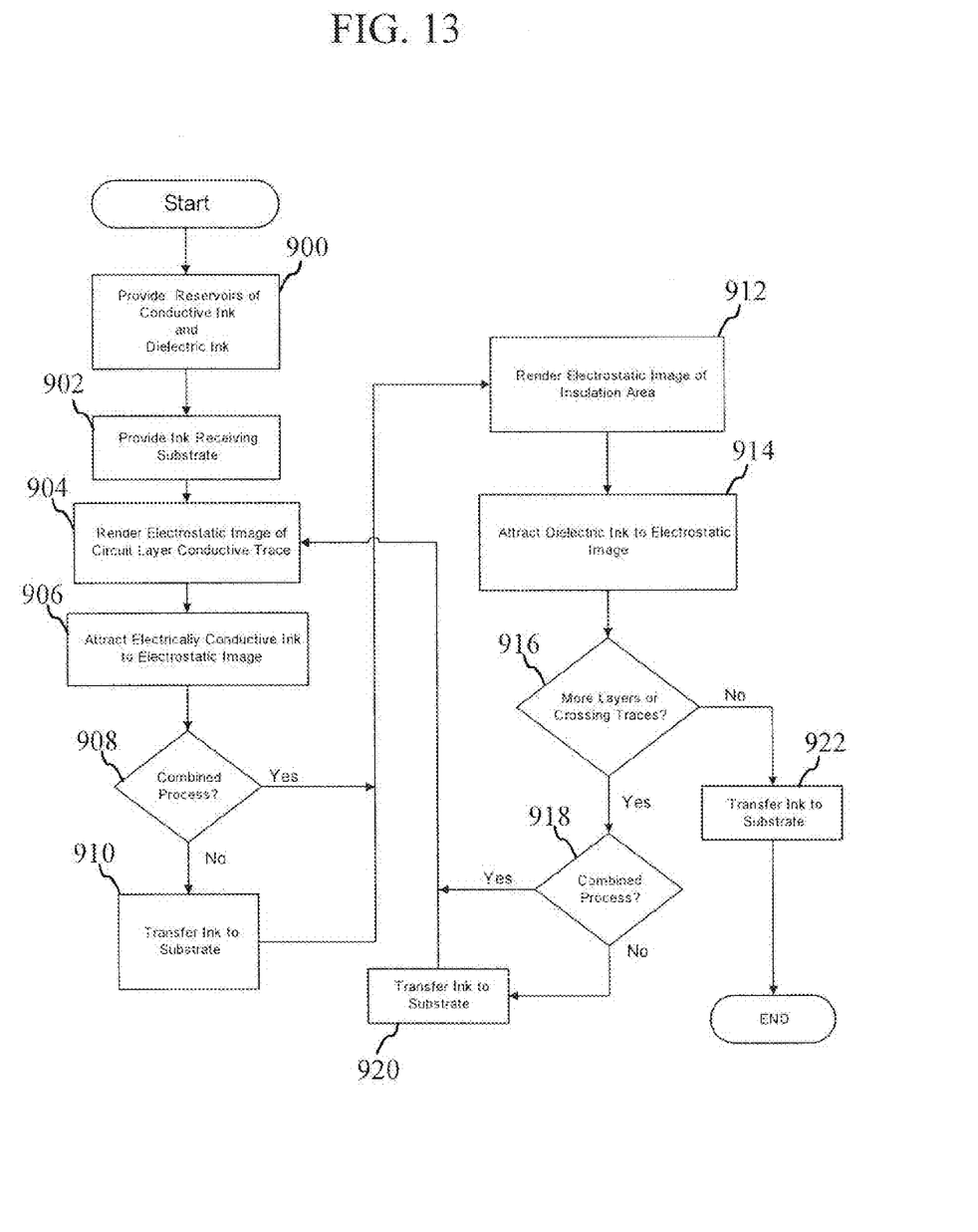
FIG. 13 is a flowchart illustrating a method of printing a PCB according to an embodiment.

The flowchart of FIG. 13 is provided to summarize at least one embodiment of printing a PCB with PCB printing system 100. It will be appreciated that the described process need not be performed in the order in which the process for providing is herein described, but that this description is merely exemplary of at least one preferred method of rendering a printed circuit board using the PCB printing system 100.

In at least one embodiment, the rendering process may be commenced by providing reservoirs of conductive ink and dielectric ink to a liquid electrophotographic printing device as shown in FIG. 1, block 900. A suitable substrate for receiving the printed electrically conductive ink and dielectric ink is also provided, block 902.

An electrostatic image of a first circuit layer having at least one conductive trace line is rendered on a photosensitive medium within the printer, block 904. As discussed above, such a rendering may be accomplished by laser 150 discharging areas of photosensitive belt 152, see FIGS. 1, 2, 3, 10, 11, and 12. The rendered electrostatic image will attract electrically conductive ink from the electrically conductive ink reservoir to the latent image, block 906. The attracted ink forms at least one electrically conductive ink trace.

Where electrically conductive ink and dielectric ink are transferred to the substrate together, the printing process may be considered a combined process. In such a case it is appropriate to provide at least one area of dielectric ink to the photosensitive medium before transferring the applied inks to the substrate. Where the process is not combined, the electrically conductive ink is transferred to the substrate, decision 908 and block 910.

In either case, an additional electrostatic image of at least one insulation area is rendered on photosensitive medium, block 912. Dielectric ink is attracted to the electrostatic image of the insulation area. The electrostatic image of at least one insulation area is also aligned to the first layer of conductive traces, block 914.

If more layers are desired for the PCB or there are crossing traces, an additional layer of conductive ink will be applied, decision 916. As above, if the process is not a combined process (decision 918), the ink presently upon the dielectric belt is transferred to the substrate (block 920) before returning to the process of rendering block 904—the rendering of the electrostatic image of a circuit layer or trace. If the process is a combined process, the ink may not be transferred to the substrate before returning to the process of block 904. If more layers or crossing traces are not at issue, the present ink upon the photosensitive medium is transferred to the substrate, block 922, and the operation may end.

Typically, electronic components are attached to PCB boards by soldering conductive pins extending from the device to the PCB board. As such it is not uncommon for a PCB to provide apertures or connection pads adjacent to conductive traces to receive such pins. In addition, under certain conditions, it may be desirable to establish a via through the PCB layers to provide contact between multiple layers. Vias and apertures may be established after printing the one or more trace layers by drilling or etching. As such drilling or etching is utilized for vias or apertures and not the general rendering of the electrical tracing, the overall PCB printing system is still considered advantageous over systems reliant upon etching for the rendering of electrical traces.

Figure 14:
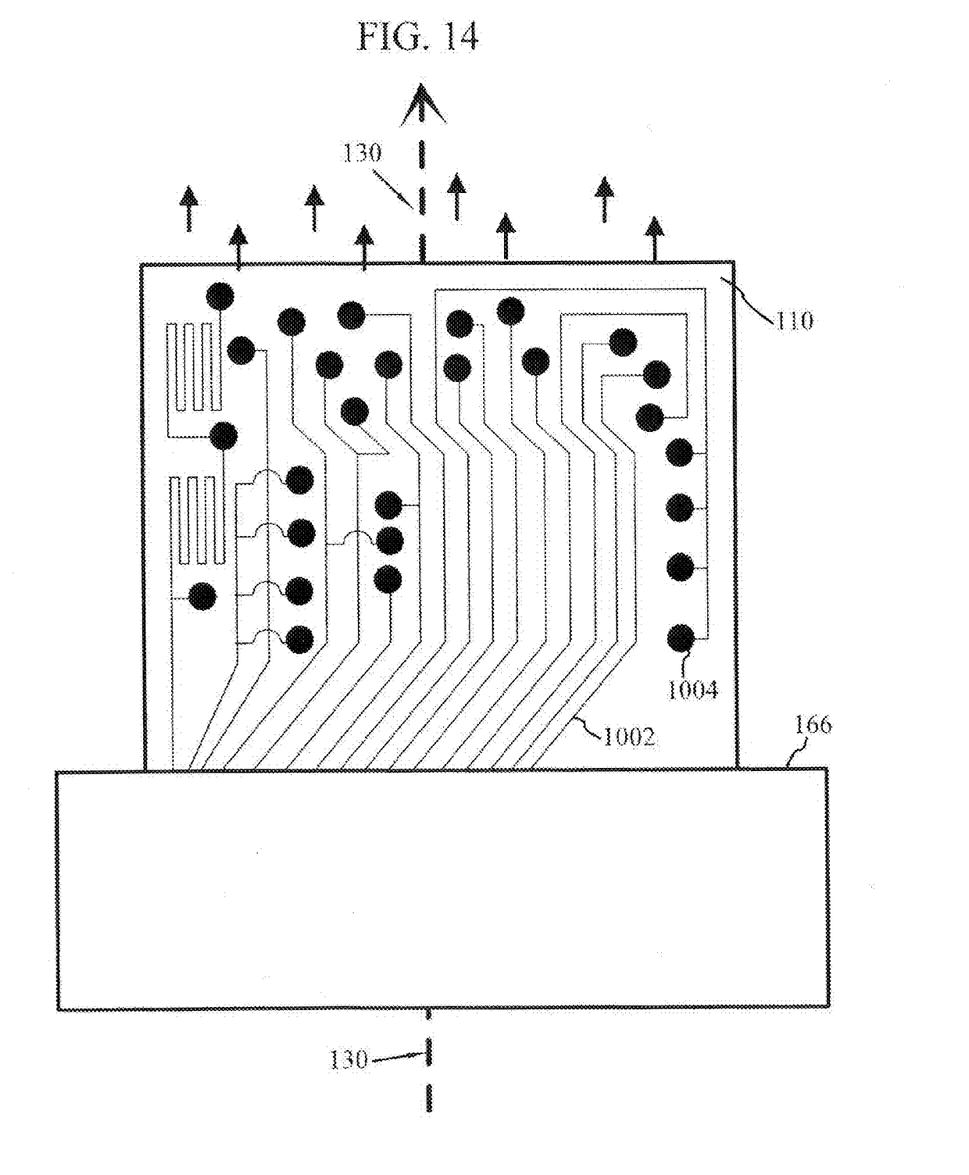
FIG. 14 is a top view of a substrate receiving a printed circuit trace in accordance with an embodiment.

FIG. 14 is an elevated view of the substrate 110 emerging from the transfer roller 166 along the media path 130. As illustrated, conductive trace lines 1002 running parallel and crossing one another have been established. Targets 1004 for solder connection (or other electrical coupling) with electrical components are also provided. Advantageously over photolithographic processes used in traditional PCB fabrication, these trace lines 1002 and targets 1004 have been established in a fast, inexpensive, and material conservation PCB printing system 100. An operator can visually review the fabricated PCB circuit, as well as render duplicate copies quickly.

Changes may be made in the above methods, systems and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

What is claimed is:

1. A printed circuit board (PCB) printing system comprising:
    a liquid electrophotographic printing device;
    at least one supplier of electrically conductive ink supplying electrically conductive ink to the electrophotographic printing device;
    at least one supplier of dielectric ink supplying dielectric ink to the electrophotographic printing device;
    wherein the liquid electrophotographic printing device is operable to apply the electrically conductive ink and the dielectric ink to a provided substrate such that a substantially immiscible boundary delineation occurs at any points of contact between the applied electrically conducive ink and the applied dielectric ink.

2. The system of claim 1, wherein the conductive ink is a metal-colloidal ink comprising metallic nano-particles selected from the group consisting of copper, gold, silver, and platinum.

3. The system of claim 1, wherein the substrate is flexible.

4. A printed circuit board (PCB) printing system comprising:
    a media path
    a photosensitive belt having at least a portion of a circuit trace image thereon;
    at least one supplier of electrically conductive ink proximate to the photosensitive belt and supplying electrically conductive ink to the circuit trace image;
    at least one supplier of dielectric ink proximate to the photosensitive belt and supplying dielectric ink to at least a portion of the supplied electrically conductive ink, a substantially immiscible boundary delineation occurring at any points of contact between applied electrically conductive ink and the applied dielectric ink; and
    a transfer medium disposed proximate to the photosensitive medium such that the inked circuit trace image transfers from the photosensitive medium to the transfer medium and from the transfer medium to a provided substrate passing along the media path.

5. The system of claim 4, wherein the conductive ink is a metal-colloidal ink comprising metallic nano-particles selected from the group consisting of copper, gold, silver, and platinum.

6. The system of claim 4, wherein the substrate is flexible.

7. The system of claim 4, wherein the transfer medium is a transfer roller.

8. The system of claim 4, wherein a plurality of electrically conductive ink suppliers and a plurality of dielectric ink suppliers are provided, the system operable to print a plurality of electrically conductive trace lines provided in multiple layers.

* * * * *

UNITED STATES PATENT AND TRADEMARK OFFICE
CERTIFICATE OF CORRECTION

| | | |
|---|---|---|
| PATENT NO. | : 7,668,487 B2 | Page 1 of 1 |
| APPLICATION NO. | : 12/481310 | |
| DATED | : February 23, 2010 | |
| INVENTOR(S) | : Manish Sharma et al. | |

It is certified that error appears in the above-identified patent and that said Letters Patent is hereby corrected as shown below:

In column 11, lines 31-32, in Claim 1, delete "conducive" and insert -- conductive --, therefor.

In column 12, line 5, in Claim 4, delete "path" and insert -- path; --, therefor.

Signed and Sealed this

Tenth Day of August, 2010

David J. Kappos
*Director of the United States Patent and Trademark Office*